(12) United States Patent
Huang et al.

(10) Patent No.: US 9,219,184 B2
(45) Date of Patent: Dec. 22, 2015

(54) AVALANCHE PHOTODIODES WITH DEFECT-ASSISTED SILICON ABSORPTION REGIONS

(75) Inventors: Zhihong Huang, Palo Alto, CA (US); Charles M. Santori, Palo Alto, CA (US); Marco Fiorentino, Mountain View, CA (US); Raymond G. Beausoleil, Redmond, CA (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 14/396,419

(22) PCT Filed: Jul. 25, 2012

(86) PCT No.: PCT/US2012/048177
§ 371 (c)(1),
(2), (4) Date: Oct. 23, 2014

(87) PCT Pub. No.: WO2014/018032
PCT Pub. Date: Jan. 30, 2014

(65) Prior Publication Data
US 2015/0076641 A1    Mar. 19, 2015

(51) Int. Cl.
| | | |
|---|---|---|
| *H01L 31/07* | (2012.01) | |
| *H01L 31/107* | (2006.01) | |
| *H01L 31/028* | (2006.01) | |
| *H01L 31/02* | (2006.01) | |
| *H01L 31/0224* | (2006.01) | |

(Continued)

(52) U.S. Cl.
CPC .......... *H01L 31/107* (2013.01); *H01L 31/028* (2013.01); *H01L 31/02027* (2013.01); *H01L 31/02325* (2013.01); *H01L 31/022416* (2013.01); *H01L 31/1075* (2013.01); *H01L 31/1804* (2013.01)

(58) Field of Classification Search
CPC ............ H01L 31/107; H01L 31/02027; H01L 31/1075
See application file for complete search history.

(56) References Cited

U.S. PATENT DOCUMENTS

| | | |
|---|---|---|
| 4,616,247 A | 10/1986 | Chang et al. |
| 5,596,186 A | 1/1997 | Kobayashi |
| 6,885,039 B2 | 4/2005 | Kuwatsuka |

(Continued)

FOREIGN PATENT DOCUMENTS

| | | |
|---|---|---|
| JP | 2004325392 A | 11/2004 |
| WO | WO-9209109 A1 | 5/1992 |

OTHER PUBLICATIONS

Doylend, J. K., et al., Silicon Photonic Resonator-Enhanced Defect-Mediated Photodiode for Sub-Bandgap Detection, Jul. 5, 2010, Optics Express, vol. 18, Issue 14, pp. 14671-14678.

(Continued)

*Primary Examiner* — Amar Movva
(74) *Attorney, Agent, or Firm* — Hewlett Packard Enterprise Patent Department

(57) ABSTRACT

An avalanche photodiode with a defect-assisted silicon absorption region. An example includes a substrate; a layer of silicon on the substrate, the layer of silicon including a positively-doped region, a negatively-doped region, and an absorption region between the positively-doped and negatively-doped regions, the absorption region including defects in its crystal structure; and contacts in electrical communication with the positively-doped and negatively-doped regions to receive a bias potential.

15 Claims, 11 Drawing Sheets

(51) Int. Cl.
*H01L 31/0232* (2014.01)
*H01L 31/18* (2006.01)

(56) References Cited

U.S. PATENT DOCUMENTS

2005/0029541 A1   2/2005   Ko
2009/0185316 A1   7/2009   Schneider et al.
2010/0127314 A1   5/2010   Frach

OTHER PUBLICATIONS

PCT International Search Report & Written Opinion, Mar. 28, 2013, PCT Application No. PCT/US2012/048177, 9 pages.

Ramirez, D.A. et al., Dependence of the Performance of Single Photon Avalanche Diodes on the Multiplication Region Width, Dec. 2008, IEEE, Journal of Quantum Electronics, vol. 44, No. 12, pp. 1188-1195.

AVALANCHE PHOTODIODES WITH DEFECT-ASSISTED SILICON ABSORPTION REGIONS

BACKGROUND

Signals between electronic components in computers and other appliances have traditionally been carried by copper wire or other metal interconnects. Increasing speeds of digital electronics have pushed this type of signal carriage to its limits, even between components on a single integrated circuit chip. Optical signals can carry vastly more data than traditional electrical signals in metallic conductors, and this has led to a need for optical communication devices on the scale of integrated circuit chips. Silicon photonic devices have attracted much attention for both on-chip and inter-chip optical signals because silicon is inexpensive and compatible with silicon CMOS component fabrication. High-efficiency silicon optical modulators, filters and waveguides have been built directly on silicon substrates. With multiplication gain, avalanche photodiodes (APDs) are ten times or more as sensitive as PIN photodiodes and are therefore attractive for low-power, high-sensitivity data links between silicon chips.

BRIEF DESCRIPTION OF THE DRAWINGS

The figures are not drawn to scale. They illustrate the disclosure by examples.

DETAILED DESCRIPTION

Figure 1:
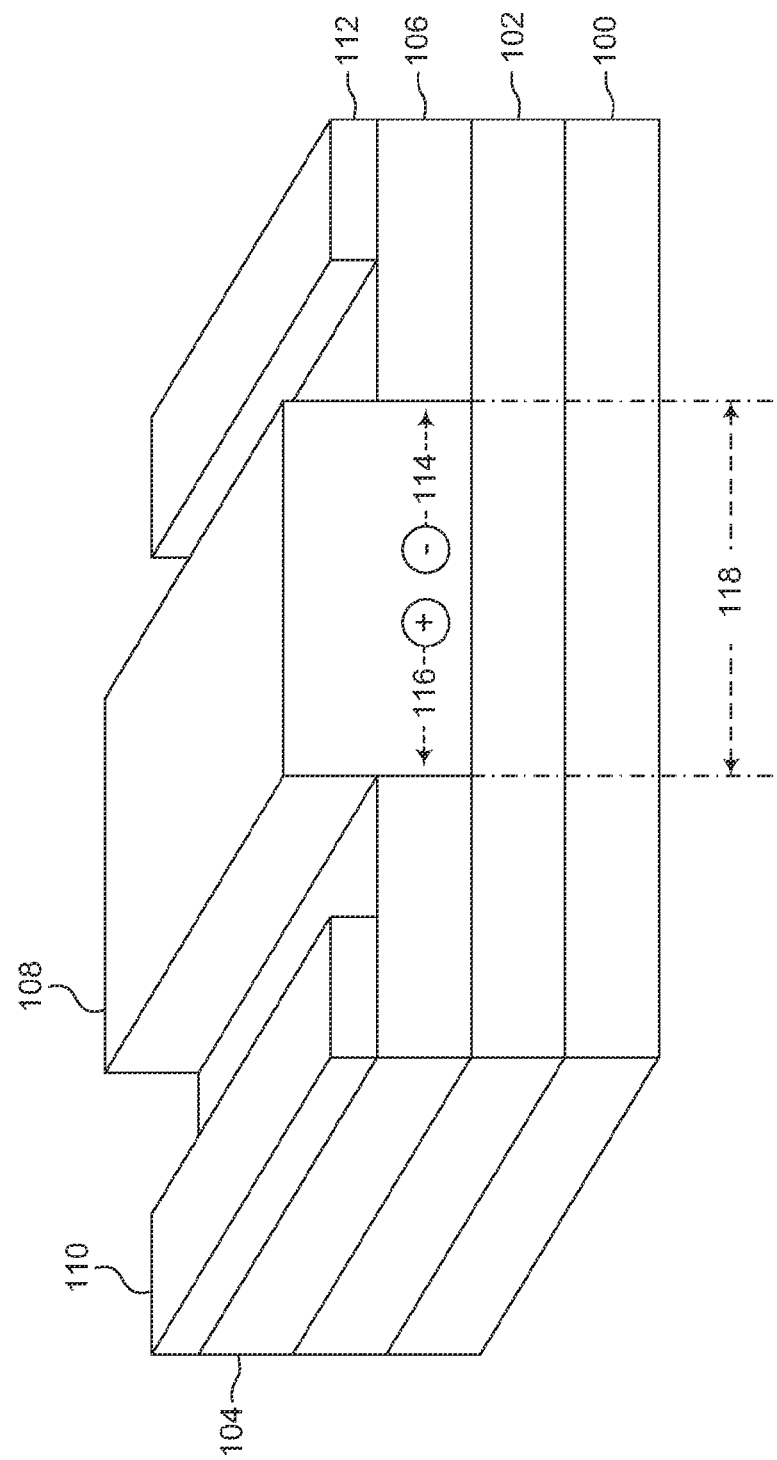
FIG. 1 is a perspective view of an example of an avalanche photodiode with a defect-assisted silicon absorption region.

Illustrative examples and details are used in the drawings and in this description, but other configurations may exist and may suggest themselves. Parameters such as voltages, temperatures, dimensions, and component values are approximate. Terms of orientation such as up, down, top, and bottom are used only for convenience to indicate spatial relationships of components with respect to each other, and except as otherwise indicated, orientation with respect to external axes is not critical. For clarity, some known methods and structures have not been described in detail. Methods defined by the claims may comprise steps in addition to those listed, and except as indicated in the claims themselves the steps may be performed in another order than that given.

Silicon APDs can be fabricated along with other silicon photonic devices and CMOS devices in a single silicon substrate, and this makes them very attractive for communication links between chips. But silicon has a bandgap of 1.1 electron-volts (eV) and as a consequence is essentially transparent at optical and near-infrared (1270 to 1740 nanometer (nm)) wavelengths. For operation in these wavelengths, silicon APDs have required the inclusion of other materials such as germanium or indium-gallium-arsenide (InGaAs) in their absorption regions because the silicon does not absorb enough of the incident optical signal. Including such materials results in a more complex fabrication sequence and increases the cost. Also, the noise figure of an APD is determined in part by the k value (ratio attic hole impact ionization rate to the electron impact ionization rate) in the avalanche multiplication region. If silicon, which has a k value=0.02 (much better than most other materials) could be used for the avalanche multiplication region, an excellent noise figure could be achieved. In addition, APDs made of materials other than silicon require operating voltages well above the 12 volts or less needed to operate other digital circuitry and therefore require more complex power supplies than would be required if APDs could operate at a potential of only 12 volts. There is a need for an all-silicon APD that provides high gain and good noise performance in near-infrared wavelengths on operating potentials of 12 volts or less.

FIG. 1 shows an example of APD with a defect-assisted intrinsic silicon absorption region. The defect-assisted absorption region provides an all-silicon APD with good gain and noise performance. Restricting the defect-assisted absorption region to a width of less than about 500 nm enables the APD to operate on a potential of 12 volts or less.

In this example of FIG. 1, a substrate 100 is covered with an oxide layer 102. A layer of silicon on the oxide layer includes a positively-doped region 104, a negatively-doped region 106, and an absorption region 108 between the positively-doped and negatively-doped regions, the absorption region having defects in its crystal structure. In this example the defect-assisted absorption region may also serve as an avalanche multiplication region for the APD. In some examples these defects are ion-induced. Contacts 110 and 112 are in electrical communication with the positively-doped and negatively-doped regions 104 and 106, respectively, to receive a bias potential.

An absorption region made of silicon would ordinarily not be effective at near-infrared wavelengths because the silicon would be transparent at those wavelengths. But the induced defects in the crystal structure of this defect-assisted absorption region change the optical characteristics of the silicon enough that it is not entirety transparent at these wavelengths and therefore can be effective as the absorption part of an APD.

Under the influence of a reverse bias potential across the positively-doped and negatively-doped regions 104 and 106, an electric field extends between these regions through the defect-assisted absorption region, causing electrons in the absorption region 108 to migrate toward the negatively-doped region 106 as indicated by an arrow 114 and holes to migrate toward the positively-doped region 104 as indicated by an arrow 116. Once the electric field is higher than the impact ionization threshold, the defect-assisted absorption region also serves as an avalanche multiplication region, multiplying the effect of photo-generated carriers and generating an output signal across the positively-doped and negatively-doped regions. The defect-assisted absorption region 108 has a width 118 less than about 500 nm to enable the device to function on a potential of not more than 12 volts.

In this example the APD is fabricated on a $p^+$-i-$n^+$ structure. Avalanche gain can be calculated by extrapolating the photocurrent from a unity-gain photo response. Due to the low 0.02 k value of silicon, this device has a low noise figure. The breakdown voltage is determined by the width 118 of the defect-assisted absorption region 108, the width 118 being also the distance between the positively and negatively doped regions. A low breakdown voltage of around 5 volts is achieved by shrinking this distance to about 400 nm.

Figure 2:
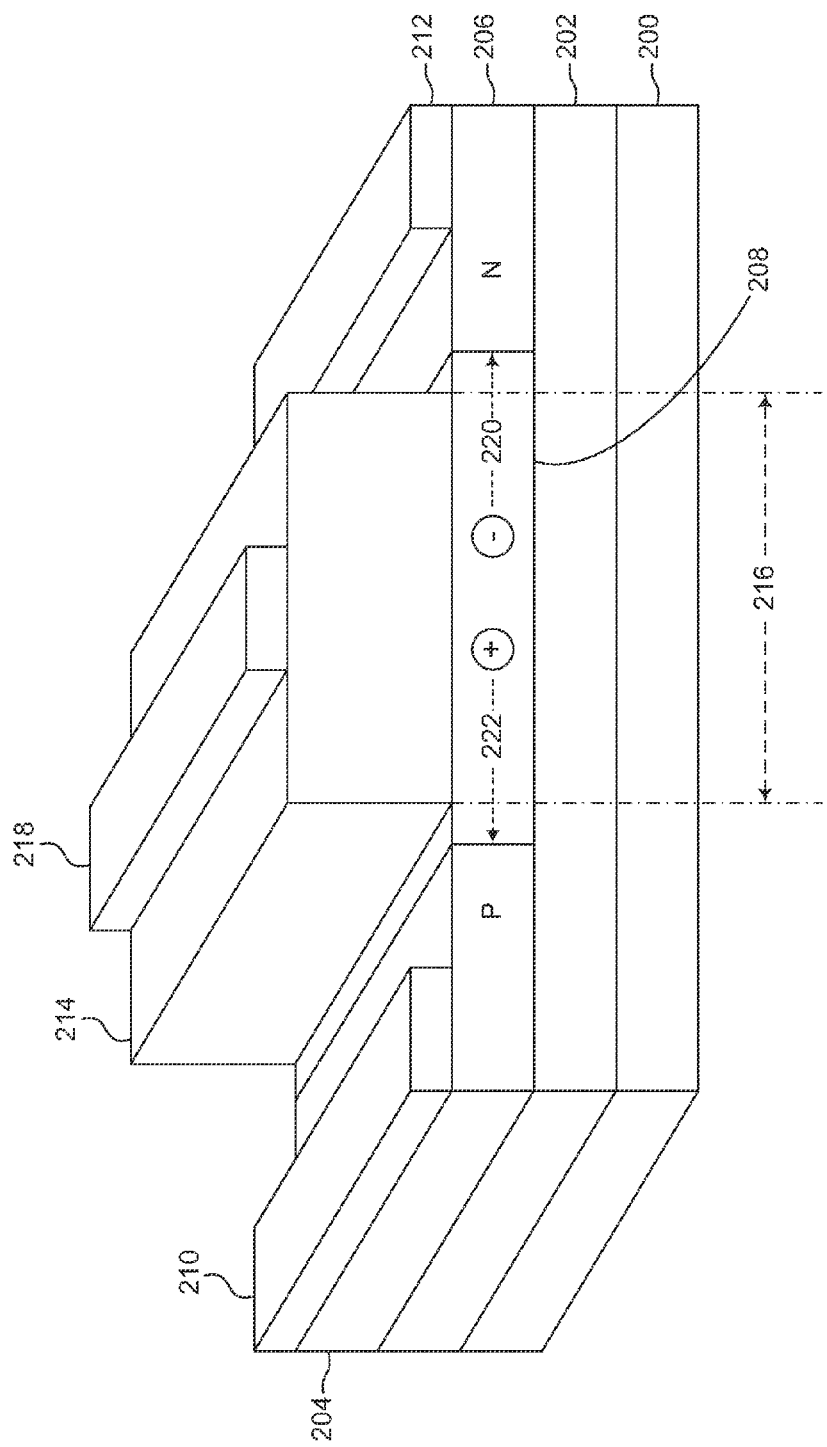
FIG. 2 is a perspective view of another example of an avalanche photodiode with a defect-assisted silicon absorption region.

FIG. 2 gives another example of an APD with a defect-assisted silicon absorption region. As in the previous example, a substrate 200 is covered with an oxide layer 202. A layer of silicon on the oxide layer includes a positively-doped region 204, a negatively-doped region 206, and an intrinsic silicon avalanche multiplication region 208 between the positively-doped and negatively-doped regions. Contacts 210 and 212 are in electrical communication with the positively-doped and negatively-doped regions 204 and 206, respectively, to receive a reverse bias potential and create a large lateral electric field in the intrinsic Si region 216.

A defect-assisted silicon absorption region 214 is disposed over a portion 216 of the avalanche multiplication region 208 between and not contacting the doped regions 204 and 206. The defect-assisted silicon absorption region 214 has defects in its crystal structure; in some examples these defects are ion induced. An electrical contact 218 is in electrical communication with the defect-assisted absorption region 214 to receive a bias potential that in some examples is negative with respect to the positively-doped region 204.

As in the previous example, with a reverse bias across the positively-doped and negatively-doped regions 204 and 206, an electric field extends between these regions through the avalanche multiplication region 208 causes electrons to migrate toward the negatively-doped region 206 as indicated by an arrow 220 and holes to migrate toward the positively-doped region 204 as indicated by an arrow 222. By biasing the defect-assisted absorption region 214 negatively with respect to the positively-doped region 204, generated photo carriers will be transported from the defect-assisted absorption region 214 to the avalanche multiplication region 208. Maximal multiplication gain is achieved by operating close to avalanche breakdown voltage. In some examples this structure results in even lower dark current and less scattering loss than the structure in the example of FIG. 1, because the defect-assisted absorption region 214 with its crystal-structure defects is separate from the avalanche multiplication region 208.

Figure 3A:
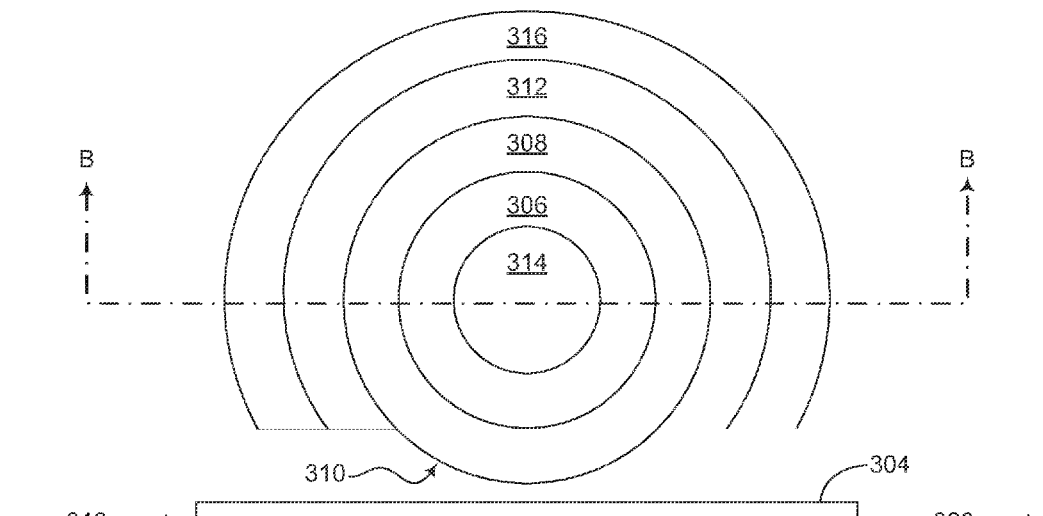
FIG. 3A is a top view of an example of a ring-resonator avalanche photodiode with a defect-assisted silicon absorption region.
Figure 3B:
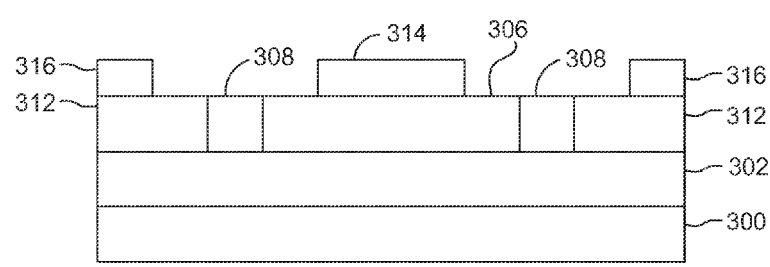
FIG. 3B is a sectional view taken along the line B-B of FIG. 3A.

FIGS. 3A and 3B give an example of a ring-resonator avalanche photodiode with a defect-assisted silicon absorption region. A substrate 300 has an oxide layer 302 on it. A linear optical waveguide 304 is formed in a silicon layer on the oxide. A circular first electrically-doped region 306 is formed in the silicon layer and is surrounded by an annular defect-assisted absorption region 308 formed in the silicon layer. The absorption region 308 includes a plurality of defects, which in some examples are ion-induced, in its silicon crystal structure. This defect-assisted absorption region 308 also serves as an avalanche multiplication region. A portion 310 of the defect-assisted absorption region 308 is in light-receiving relationship with the waveguide 304. A second electrically-doped region 312 in the silicon layer partially encircles the absorption region. Contacts 314 and 316 are in electrical communication with the first and second electrically-doped regions 306 and 312, respectively, to receive a reverse bias potential to be applied to the electrically-doped regions.

A light beam may propagate into one end of the waveguide as indicated by an arrow 318 and out the other end as indicated by an arrow 320. A portion of the light is received by the defect-assisted absorption region 310.

In some examples the first electrically-doped region 306 is positively doped and the second electrically-doped region 312 is negatively doped. In other examples this is reversed.

Figure 3C:
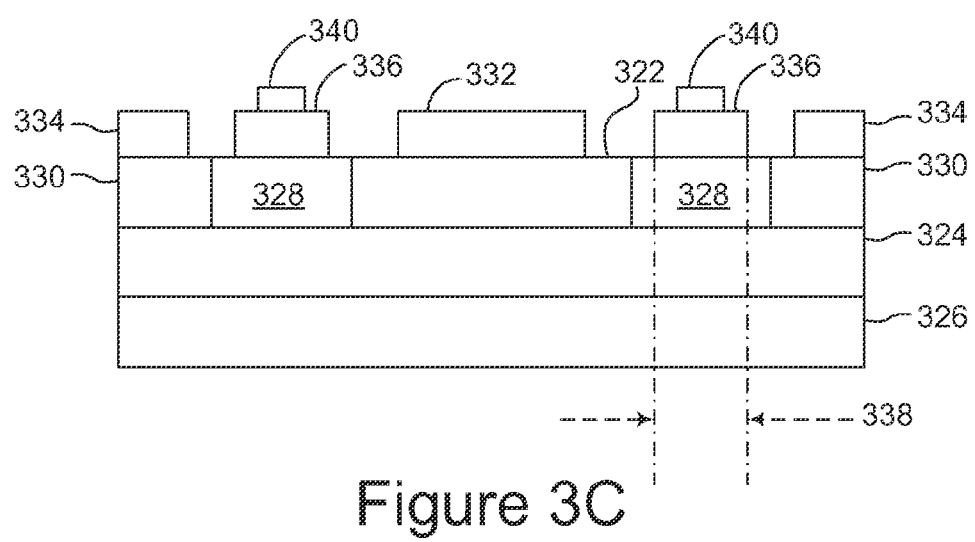
FIG. 3C is similar to FIG. 3B but shows an example of a ring-resonator avalanche photodiode with a defect-assisted silicon absorption region and a separate avalanche multiplication region.

In the foregoing example the defect-assisted absorption region 308 also comprises an avalanche multiplication region. Another example of a ring-resonator avalanche photodiode with a defect-assisted silicon absorption region is shown in FIG. 3C. In this example a circular first electrically-doped region 322 is formed in a silicon layer 324 on a substrate 326. The region 322 is surrounded by an annular avalanche multiplication region 328 formed in the silicon layer 324. A second electrically-doped region 330 in the silicon layer partially encircles the multiplication region 328. Contacts 332 and 334 are in electrical communication with the first and second electrically-doped regions 322 and 330, respectively, to receive a reverse bias potential to be applied to the electrically-doped regions. An annular defect-assisted silicon absorption region 336 overlies a portion 338 of the avalanche multiplication region 328 and does not contact either the doped region 322 or the doped region 330. The defect-assisted absorption region 336 includes a plurality of defects, which in some examples are ion-induced, in its silicon crystal structure. As in the previous example, a portion of the defect-assisted absorption region 336 is in light-receiving relationship with a waveguide (not shown) similar to the waveguide 304. A contact 340 is formed on the defect-assisted absorption region 336.

A method of fabricating an avalanche photodiode with a defect-assisted silicon absorption region is illustrated in FIGS. 4A through 4G. In some examples the method begins with forming a silicon layer 400 on a silicon-on-insulator (SOI) substrate 402. The silicon layer 400 may be etched to define a center area 408 that projects above a surface 410 of a side area 412 and a surface 414 of a side area 416. The center area 408 may project above the surfaces 410 and 414 as much as 250 nm as indicated by arrow A. The side areas 412 and 416 are between about 200 nm and 2 micrometers (μm) thick as indicated by arrow B. In some examples the center area 408 does not project above the side areas.

Figure 4A:
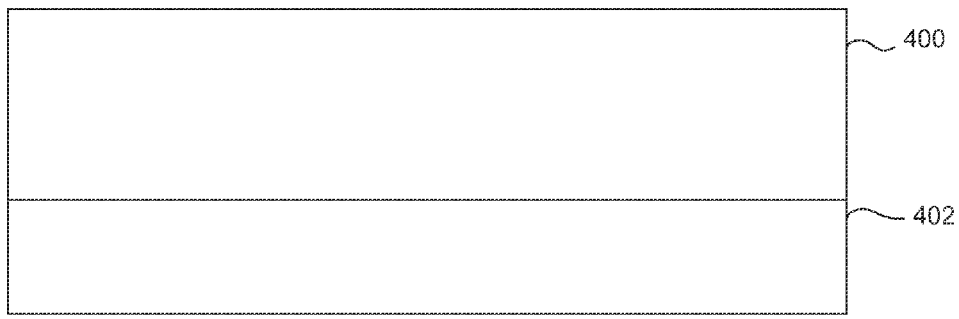
FIGS. 4A through 4G are sectional views of an example of a method of fabricating an avalanche photodiode with a defect-assisted silicon absorption region.
Figure 4B:
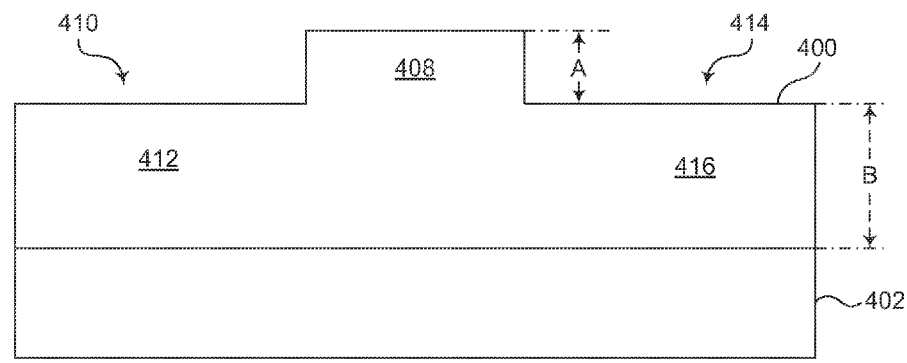
Figure 4C:
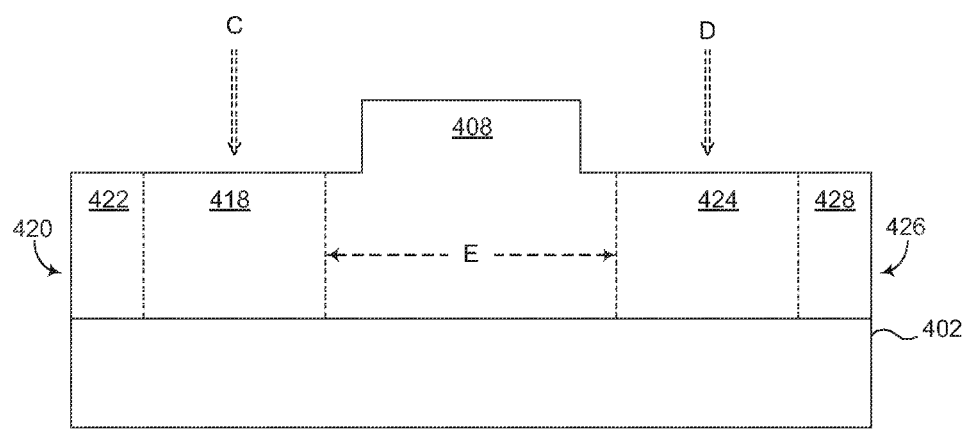

As shown in FIG. 4C, the side area 412 is positively doped as indicated by arrow C to define a P$^+$ region 418. In some examples this is accomplished by a boron implant of about $10^{19}$ cm$^{-3}$. In some examples the P$^+$ region 418 extends to an edge 420 of the side area 412, but in this example the P$^+$ region 418 extends only part way to the edge 420, leaving undoped region 422 between the edge 420 and the P$^+$ region 418.

Similarly, the side area 416 is negatively doped as indicated by arrow D to define an N$^+$ region 424, for example by a phosphorus implant of about $10^{19}$ cm$^{-3}$. In some examples the N$^+$ region 424 extends to an edge 426 of the side area 416, but in this example the N$^+$ region 424 extends only part way to the edge 426, leaving an undoped region 428 between the edge 426 and the N$^+$ region 424. The P$^+$ region 418 and the N$^+$ region 424 are about 400 nm to one μm apart as indicated by arrow E.

Figure 4D:
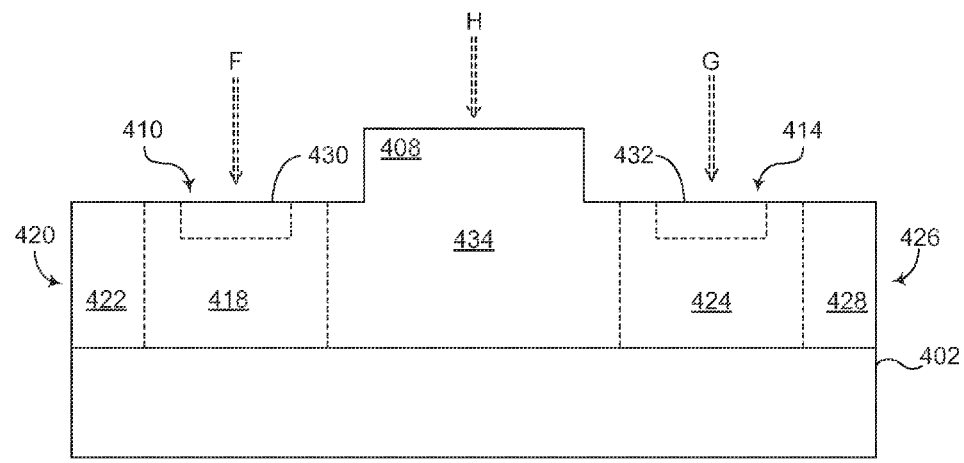

In some examples, as shown in FIG. 4D, a portion of the side area 412 is strongly positively-doped as indicated by arrow F to define a shallow P$^{++}$ region 430 within the P$^+$ region 418 and adjacent the surface 410, for example by a boron implant exceeding $10^{20}$ cm$^{-3}$.

A portion of the side area 416 is strongly negatively-doped as indicated by arrow G to define an N$^{++}$ region 432 within the N$^+$ region 424 and adjacent the surface 414, for example by a phosphorus implant exceeding $10^{20}$ cm$^{-3}$.

Structural defects are induced in the crystal structure of the center area. 408, for example by silicon ion bombardment as indicated by arrow H to form in the center area 408 a defect-assisted silicon absorption region 434. In this example the defect-assisted absorption region 434 also serves as an avalanche multiplication region.

Figure 4E:
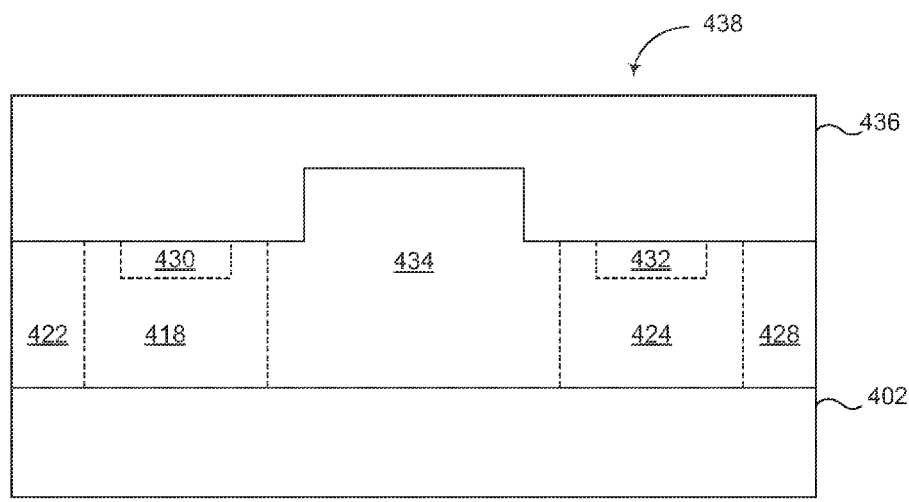
Figure 4F:
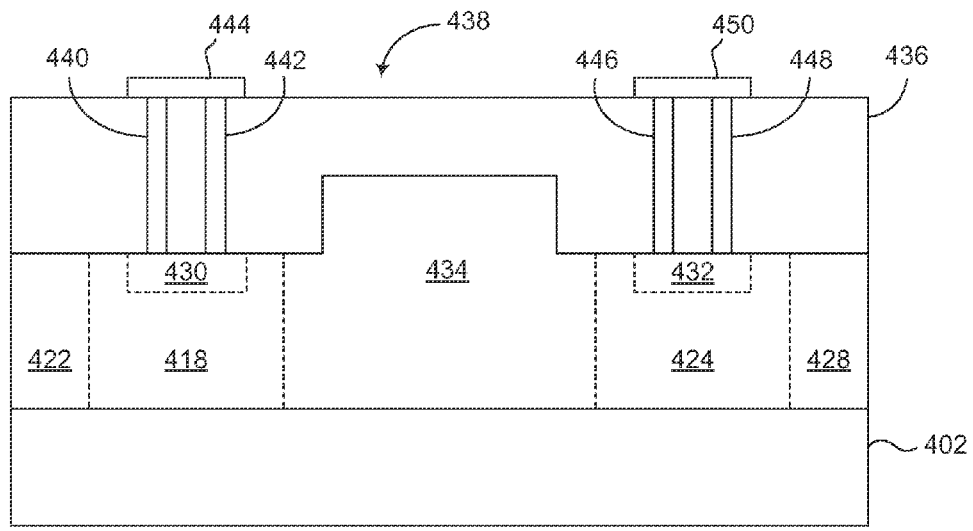

As shown in FIGS. 4E and 4F, a passivation layer 436 (for example silicon dioxide) is deposited over the foregoing structure. Openings are etched through the passivation layer from a surface 438 to the $P^{++}$ region 430. Conducting material is deposited in the openings to form conductors 440 and 442 from the $P^{++}$ region 430 to the surface 438. A contact 444 is placed on the conductors, establishing an electrical path between the contact 444 and the $P^{++}$ region 430. Similarly, openings are etched through the passivation layer from the surface 438 to the $N^{++}$ region 432. Conducting material is deposited in the openings to form conductors 446 and 448 from the $N^{++}$ region 432 to the surface 438. A contact 450 is placed on the conductors, establishing an electrical path between the contact 450 and the $N^{++}$ region 432. In some examples the contact 444 is positively biased up to 12 volts with respect to the contact 450.

In some examples only one conductor may be used between each contact and its corresponding doped region.

In some examples the conducting material may contact the $P^+$ and $N^+$ regions 418 and 424 rather than the $P^{++}$ and $N^{++}$ regions 430 and 432.

In some examples the defect-assisted absorption region 434 may be etched to form a waveguide.

Figure 4G:
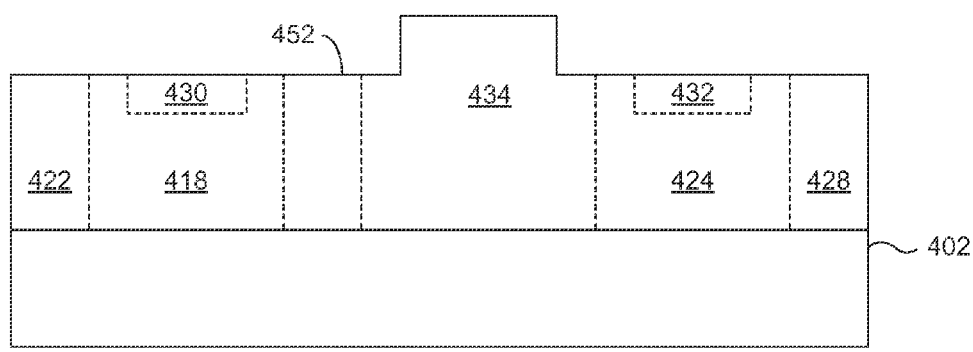

As shown in FIG. 4G, in some examples an avalanche multiplication region 452 may be fabricated between the defect-assisted absorption region 434 and the $P^+$ region 418. Similarly, an avalanche multiplication region may be formed between the defect-assisted absorption region 434 and the $N^+$ region 424.

Another example of a method of fabricating an avalanche photodiode with a defect-assisted silicon absorption region is illustrated in FIGS. 5A through 5E. In this example the method begins with forming a silicon layer 500 on a silicon-on-insulator substrate (SOI) 502. The silicon layer may be between about 200 nm to 2 μm thick as indicated by arrow A.

A portion of the silicon layer 500 is positively doped as indicated by arrow B to define a $P^+$ region 504. In some examples this is accomplished by a boron implant of about $10^{19}$ cm$^{-3}$. In some examples the $P^+$ region 504 extends to an edge 506 of the silicon layer 500, but in this example the $P^+$ region 504 extends only part way to the edge 506, leaving an undoped region 508 between the edge 506 and the $P^+$ region 504.

Similarly, another portion of the silicon layer 500 is negatively doped as indicated by arrow C to define an $N^+$ region 510, for example by a phosphorus implant of about $10^{19}$ cm$^{-3}$. In some examples the $N^+$ region 510 extends to an edge 512 of the silicon layer 500, but in this example the $N^+$ region 510 extends only part way to the edge 512, leaving an undoped region 514 between the edge 512 and the $N^+$ region 510. The $P^+$ region 504 and the $N^+$ region 510 are separated by an intrinsic region 516 about 400 nm to one μm wide as indicated by arrow D.

Figure 5A:
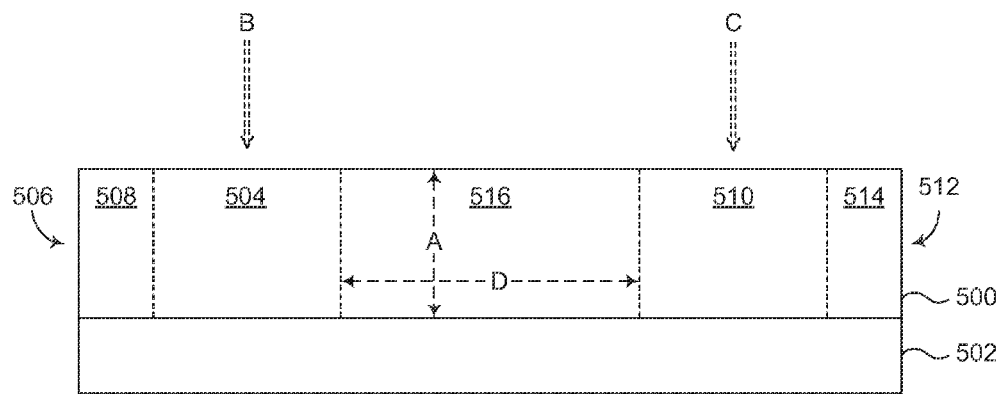
FIGS. 5A through 5E are sectional views of another example of a method of fabricating an avalanche photodiode with a defect-assisted silicon absorption region.
Figure 5B:
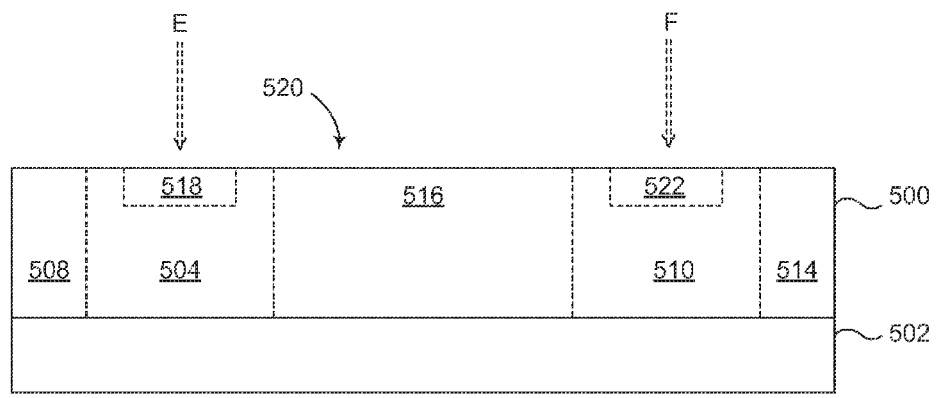

As shown in FIG. 5B, in some examples a portion of the $P^+$ region 504 is strongly positively-doped as indicated by arrow E to define a shallow $P^{++}$ region 518 within the $P^+$ region 504 and adjacent a surface 520 of the silicon layer 500, for example by a boron implant exceeding $10^{20}$ cm$^{-3}$.

Similarly, a portion of the $N^+$ region 510 is strongly negatively-doped as indicated by arrow F to define an $N^{++}$ region 522 within the $N^+$ region 510 and adjacent the surface 520, for example by a phosphorus implant exceeding $10^{20}$ cm$^{-3}$.

Figure 5C:
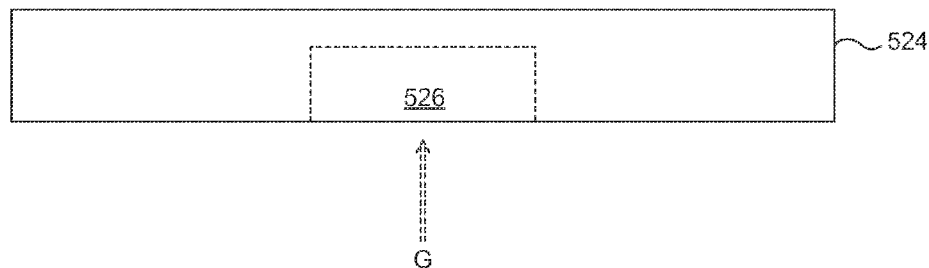
Figure 5D:
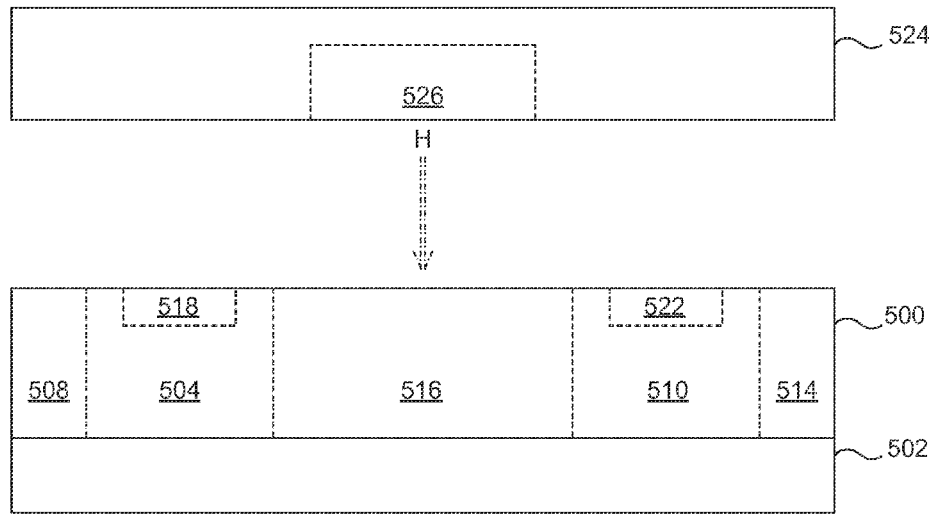
Figure 5E:
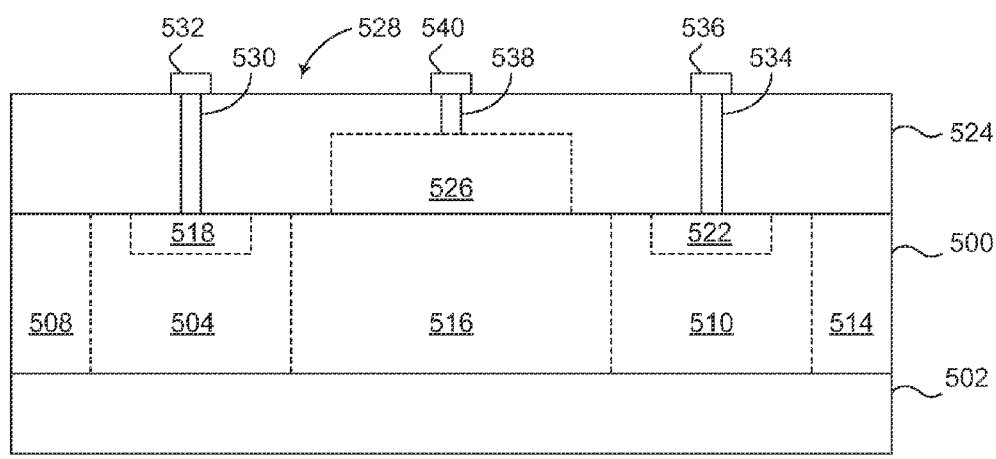

Meanwhile, referring to FIG. 5C, structural defects are induced in the crystal structure of a portion of a silicon wafer 524, for example by silicon ion bombardment as indicated by arrow G, to form a defect-assisted silicon absorption region 526. Then the wafer 524 is wafer-bonded to the silicon layer 500 with the defect-assisted silicon absorption region 526 covering a portion of the intrinsic region 516, as shown in FIG. 5D. The intrinsic region 516 may serve as an avalanche multiplication region.

An opening may be formed from a surface 528 to the $P^{++}$ region 518. Conducting material is deposited in the opening to form a conductor 530 from the $P^{++}$ region 518 to the surface 528. A contact 532 is placed on the conductor. Similarly, an opening is formed from the surface 528 to the $N^{++}$ region 522 and conducting material is deposited in the opening to form a conductor 534 from the $N^{++}$ region 522 to the surface 528. A contact 536 is placed on the conductor.

In some examples an opening is formed from the surface 528 to the defect-assisted silicon absorption region 526, conducting material is deposited in the opening to form a conductor 538, and a contact 540 is placed on the conductor. The $P^{++}$ region 518 may be negatively biased with respect to the $N^{++}$ region 522, and the absorption region 526 may be biased at an intermediate potential between the $P^{++}$ and $N^{++}$ regions.

Avalanche photodiodes with defect-assisted silicon absorption regions operate at near-infrared wavelengths with high quantum efficiency. These photodiodes are economical to manufacture because they avoid any need for using other materials such as germanium, or other compounds. The low k value of silicon photodiodes, which results in a very low noise figure, makes silicon a nearly ideal material for fabricating avalanche photodiodes.

What is claimed is:

1. An avalanche photodiode with a defect-assisted silicon absorption region, the photodiode comprising:
    a layer of silicon on a substrate, the layer of silicon including a positively-doped region, a negatively-doped region, and an absorption region between the positively-doped and negatively-doped regions, the absorption region including defects in its crystal structure; and
    contacts in electrical communication with the positively-doped and negatively-doped regions to receive a bias potential.

2. The photodiode of claim 1 wherein the defects in the silicon crystal structure comprise ion-induced defects.

3. The photodiode of claim 1 wherein at least a portion of the absorption region comprises an avalanche multiplication region.

4. The photodiode of claim 1 and further comprising an intrinsic silicon avalanche multiplication region between the positively-doped and negatively-doped regions.

5. The photodiode of claim 4 wherein the absorption region overlies the avalanche multiplication region.

6. The photodiode of claim 1 and further comprising an avalanche multiplication region between the absorption region and the one of the doped regions.

7. The photodiode of claim 1 wherein the positively-doped region comprises a strongly-doped portion and the negatively-doped region comprises a strongly-doped portion.

8. A ring-resonator avalanche photodiode with a defect-assisted silicon absorption region, the photodiode comprising:
    a silicon layer on a substrate;
    a linear optical waveguide formed in the silicon layer;
    a circular first electrically-doped region in the silicon layer;

an annular absorption region in the silicon layer surrounding the first electrically-doped region, the absorption region including a plurality of defects in its silicon crystal structure, a portion of the absorption region in light-receiving relationship with the waveguide;

a second electrically-doped region in the silicon layer partially encircling the absorption region; and contacts in electrical communication with the first and second electrically-doped regions to receive a reverse bias potential.

9. The photodiode of claim 8 wherein the defects in the silicon crystal structure comprise ion-induced defects.

10. The photodiode of claim 8 wherein the absorption region comprises an avalanche multiplication region.

11. The photodiode of claim 8 and further comprising an intrinsic silicon avalanche multiplication region between the first and second electrically-doped regions, and wherein the absorption region is disposed over the avalanche multiplication region.

12. A method of fabricating an avalanche photodiode with a defect-assisted silicon absorption region, the method comprising:
   forming in a silicon layer first and second regions for doping and an intrinsic avalanche multiplication region between the first and second regions;
   doping the first region to form a positively-doped region;
   doping the second region to form a negatively-doped region;
   inducing structural defects in an absorption region between the first and second regions; and
   forming electrical contacts with the positively-doped and negatively-doped regions.

13. The method of claim 12 wherein the intrinsic region comprises the absorption region.

14. The method of claim 12 wherein the absorption region is disposed on the intrinsic region.

15. The method of claim 12 and further comprising strongly doping a portion of the positively-doped region and a portion of the negatively-doped region.

* * * * *